United States Patent [19]

Mok

[11] Patent Number: 5,519,535
[45] Date of Patent: May 21, 1996

[54] PRECISION PLACEMENT APPARATUS HAVING LIQUID CRYSTAL SHUTTERED DUAL PRISM PROBE

[75] Inventor: Swee M. Mok, Schaumburg, Ill.

[73] Assignee: Motorola, Inc., Schaumburg, Ill.

[21] Appl. No.: 222,058

[22] Filed: Apr. 4, 1994

[51] Int. Cl.⁶ .............................. G02B 27/14; G01B 11/00
[52] U.S. Cl. .......................... 359/629; 359/638; 356/399; 356/401
[58] Field of Search ..................................... 359/629, 831, 359/833, 834, 638, 77, 78; 356/399, 400, 401

[56] References Cited

U.S. PATENT DOCUMENTS

| | | | |
|---|---|---|---|
| 3,684,384 | 8/1972 | Hojo | 356/399 |
| 3,751,170 | 8/1973 | Hidaka | 356/172 |
| 4,636,080 | 1/1987 | Feldman | 356/401 |
| 4,652,134 | 3/1987 | Pasch | 356/401 |
| 4,685,807 | 8/1987 | Picard | 356/401 |
| 5,137,363 | 8/1992 | Kosugi | 356/401 |
| 5,187,372 | 2/1993 | Clube | 250/548 |
| 5,280,332 | 1/1994 | Torcher | 356/16 |
| 5,311,304 | 5/1994 | Monno | 356/399 |
| 5,457,538 | 10/1995 | Ujiie | 356/399 |

FOREIGN PATENT DOCUMENTS 0218516  12/1984  Japan ..................... 356/399

OTHER PUBLICATIONS

J. V. Culver, "Two Color Optical Alignment–System", Mar. 1975, p. 2983, vol. 17, No. 10, IBM Technical Disclosure Bulletin.

C. A. Gaston, "Alignment Beamsplitter Cube", Oct. 1982, pp. 2301–2303 vol. 25, No. 5, IBM Technical Disclosure Bulletin.

Primary Examiner—Georgia Y. Epps
Assistant Examiner—Ricky Mach
Attorney, Agent, or Firm—Douglas D. Fekete

[57] ABSTRACT

A precision placement apparatus comprises an improved probe for aligning a component and a substrate based upon features on the inner surfaces arranged in facing, spaced relationship, prior to assembling the component to the substrate. The probe comprises a dual prism assembly having a first face for viewing the componenet surface and a second face for viewing the substrate surface. The dual prism assembly superposes the images of the surfaces to permit an operator to accurately align the elements. A liquid crystal shutter is mounted onto one face of the dual prism assembly to exclude the image of the corresponding surface and thereby allow the operator to quickly determine the features of the other surface in order to make the appropriate adjustments.

6 Claims, 2 Drawing Sheets

PRECISION PLACEMENT APPARATUS HAVING LIQUID CRYSTAL SHUTTERED DUAL PRISM PROBE

BACKGROUND OF THE INVENTION

This invention relates to a precision placement apparatus comprising a dual prism assembly for providing superposed images of facing surfaces. More particularly, this invention relates to a dual prism probe for such apparatus that includes a liquid crystal shutter that is selectively actuated for distinguishing features during image analysis.

In the manufacture of microelectronic packages, assembly of a component to a substrate may require precise alignment of features on facing surfaces. For example, in forming solder bump interconnections, solder bumps affixed to an integrated circuit die are aligned with bond pads disposed on a printed circuit board or like substrate. For assembly, the component and the substrate are mounted onto moveable fixtures so that the component is spaced above the substrate. A dual prism assembly is positioned between the component and the substrate with one face toward the component for receiving an image of the component surface and an opposite face toward the substrate for receiving an image of the substrate surface. These images are fed to a camera, which, in turn, provides a video display of the superposed images. An operator then adjusts the relative positions of the component and the substrate to align the bumps and the pads. This may include linear adjustments along perpendicular x-y axes, as well as rotational adjustments. The probe is then withdrawn, and the component is lowered onto the substrate for assembly.

The superposing of images by the dual prism assembly provides a convenient and accurate visual technique for determining alignment. However, in viewing the display of the superposed images, the operator has difficulty in readily distinguishing the features of the component from those of the substrate in order to make the proper adjustment. The operator may then resort to an arbitrary adjustment to one element while observing the shift in the display. This trial-and-error approach increases the correction and prolongs the time for aligning the elements. Moreover, this technique greatly complicates efforts to automate the alignment process. Therefore, there exists a need for an improved precision placement apparatus to permit features of one surface to be readily distinguished from those of the other surface in order to facilitate proper adjustment.

BRIEF DESCRIPTION OF THE DRAWINGS

The present invention will be further illustrated with reference to the accompanying drawings wherein.

DETAILED DESCRIPTION OF THE INVENTION

Figure 1:
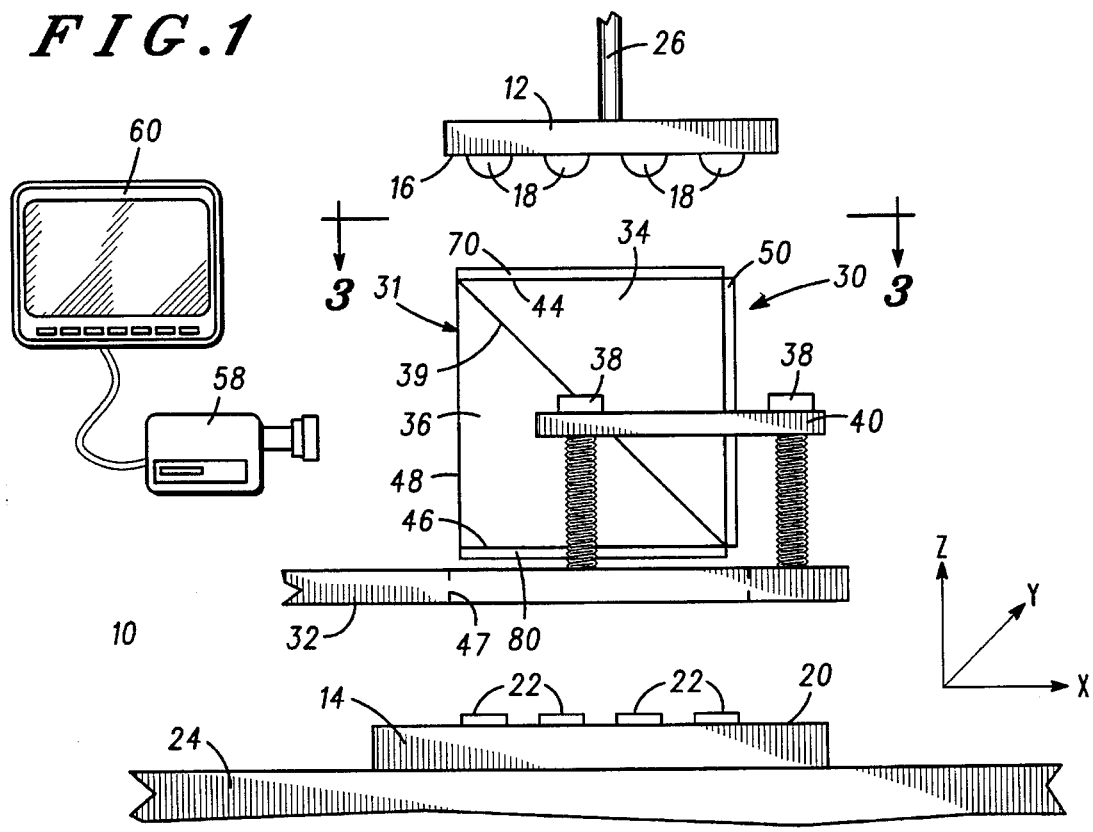
FIG. 1 is a schematic view showing a precision placement apparatus in accordance with this invention.

Referring to FIG. 1, by way of an example of a typical assembly operation, a precision placement apparatus 10 is employed for mounting a component, which is an integrated circuit die 12, onto a substrate, which is a printed circuit board 14. Component 12 comprises an inner surface 16 that includes an array of solder bumps 18. Similarly, printed circuit board 14 comprises an inner surface 20 that includes an array of bond pads 22 disposed in a pattern superposable with respect to solder bumps 18. For assembly, die 12 is placed onto board 14 such that each solder bump 18 rests against a corresponding bond pad 22. Thereafter, the assembly is heated to reflow the solder to bond component 12 to board 14. The resulting solder bump interconnections not only attach the die to the board, but also electrically connect the circuit trace of the board to the input and output pads of the die for conducting electrical signals to or from the die for processing. Misalignment of the component so that the solder bump is offset from the bond pad prevents the solder from reflowing onto the pad to form the desired connection and thus may render the assembled package inoperative. Typically, dimensions for the solder bumps and bond pads are on the order of tens of microns. Thus, microscopic precision is required to accurately align the solder bumps onto the bond pads.

Apparatus 10 comprises an x-y table 24 onto which printed circuit board 14 is placed. Table 24 is adapted for precise linear microscopic adjustment in the directions of the x-y axis. Apparatus 10 also includes vacuum fixture 26 for handling component 12 during placement. Fixture 26 attaches to component 12 opposite to inner surface 16 and is adapted for precise rotational adjustment and also for precise z axis movement for component placement following alignment. A suitable apparatus comprising an x-y table and vacuum fixture is commercially available from Sierra Research and Technology, Inc., under the trade designation Microplace 2000F. As shown in FIG. 1, in preparation for precise alignment and assembly, component 12 is mounted onto vacuum fixture 26 and positioned above printed circuit board 14 on table 24 with surfaces 16 and 20 facing, but spaced apart.

Figure 3:
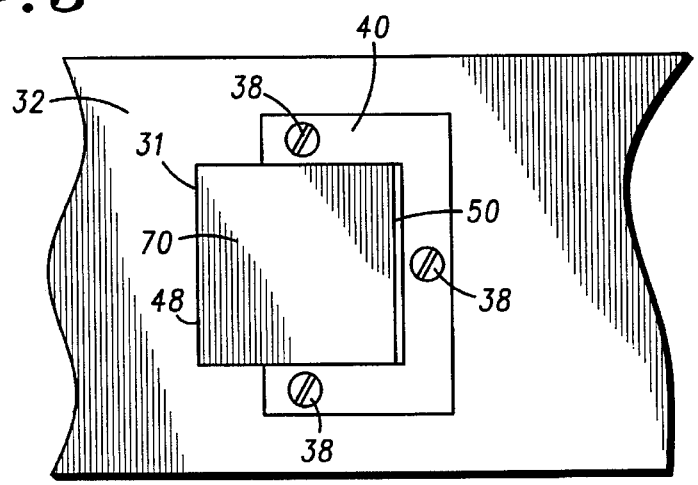
FIG. 3 is a plan view of the dual prism probe in FIG. 2 taken along line 3—3 in the direction of the arrow.
Figure 2:
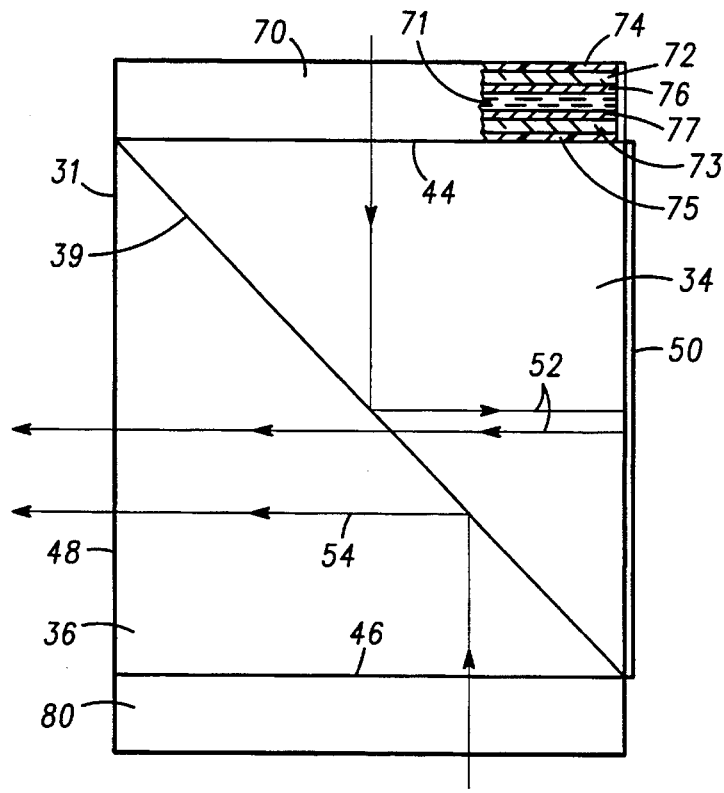
FIG. 2 is a elevational view of a dual prism probe of the precision placement apparatus in FIG. 1 showing details thereof.

Precision placement apparatus 10 further comprises a dual prism probe 30 mounted onto an arm 32 that is reciprocal between an alignment position shown in FIG. 1 wherein wherein the arm is advanced to interpose probe 30 between component 12 and printed circuit board 14 for concurrently viewing surfaces 16 and 20, and a withdrawn position wherein the arm is retracted to withdraw the probe to permit lowering of component 12 onto printed circuit board 14. Referring to FIGS. 1 through 3, probe 30 comprises a dual prism assembly 31 formed of two right glass prisms 34 and 36 having hypotenuse sides that are integrally bonded at interface 39. The prisms are held in a U-shaped bracket 40 and mounted onto arm 32 by three set screws 38 disposed in a triangular arrangement for fine adjustment of the prism assembly orientation. The dual prism assembly 30 comprises a first, upper face 44 oriented towards component surface 16, a second, lower face 46 opposite face 44 and oriented towards printed circuit board 20, and an imaging face 48. Prism assembly 30 also includes a mirror 50 affixed to prism 34 opposite imaging face 48. When the probe is in the viewing position interposed between surfaces 16 and 20, an image of component surface 16 is received through upper face 44. Light forming the image of surface 16 is internally reflected as indicated by arrows 52 and emitted from face 48. Concurrently, an image of board surface 20 is received through an opening 47 in arm 32 by lower face 46, with the light forming the image being internally reflected as indicated by arrows 54 and simultaneously emitted from face 48. Thus, the images of both surfaces are superposed by the dual prism assembly and viewed at imaging face 48. Face 48 is viewed by a camera 58 that captures the superposed images and transmits them to a video display 60 for viewing by an operator.

In accordance with this invention, probe 30 further includes a liquid crystal shutter 70 affixed to dual prism assembly 31 and covering face 44. Referring particularly to FIG. 2, liquid crystal shutter 70 comprises a lamilar structure that includes a central layer 71 of a nematic liquid crystal material sandwiched between transparent plates 72 and 73 and also between polarizers 74 and 75 having perpendicular axis of polarization. Transparent electrodes 76 and 77, formed, for example, of indium tin oxide, are applied to the inner surfaces of the glass plates adjacent to the liquid crystal layer, and are connected through suitable leads (not shown) to a remote electrical power supply. In the absence of an applied electrical field, light illuminating shutter 70 is filtered by the front polarizer, and the polarized light is reoriented by the liquid crystal layer to pass through the opposite polarizer. However, an electrical field applied between the opposite electrodes by means of electrical connections (not shown) to an external power source disrupts the liquid crystal layer to prevent the light from being reoriented to pass through the back polarizer. In this mode, the liquid crystal shutter is opaque and prevents light transmission. In the preferred embodiment, a second liquid crystal shutter 80, similar in construction to shutter 70, is affixed to lower prism face 46 and is selectively actuatable to prevent light admission to the lower face.

Figure 4:
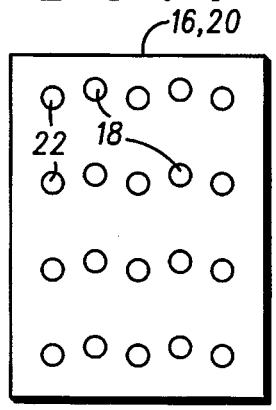
FIG. 4 is a display showing superposed images of the surfaces prior to alignment.
Figure 5:
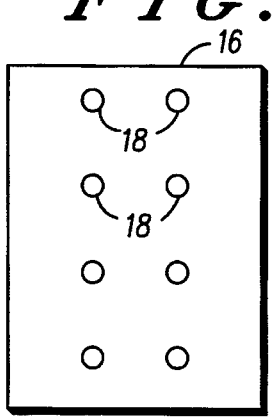
FIG. 5 is a display, similar to the display in FIG. 4, but showing features of only one surface.
Figure 6:
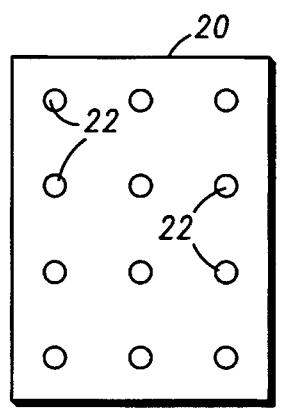
FIG. 6 is a display, corresponding to the display in FIG. 4, but showing only the other surface.
Figure 7:
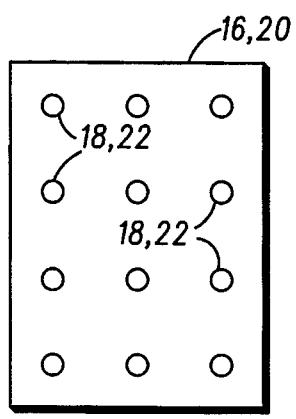
FIG. 7 is a display, similar to FIG. 4, but showing the superposed images following alignment.

Referring again to FIG. 1, for placement of die 12 onto board 14, die 12 is picked up by vacuum fixture 26 and indexed into a position above board 14 on table 24, but spaced apart along the z-axis. Reciprocal arm 32 is actuated to position probe 30 between surfaces 16 and 20 as shown in the FIG. With liquid crystal shutters 70 and 80 in a transparent condition, the images of both surfaces 16 and 20 are received by dual prism assembly 31, and superposed. The superposed image is photographed by camera 58, and displayed at video display 60 for viewing by an operator. By way of an example, FIG. 4 shows a display of the superposed images. The display includes features, notably bumps 18 of the die surface 16, as well as features, notably pads 22, of the board surface 20. FIG. 4 depicts a simplified display, whereas the display typically may include numerous other features, and thus presents a complex picture that the operator must then analyze. In accordance with this invention, liquid crystal shutter 80 is actuated by applying an electrical potential to the internal electrodes. As a result, liquid crystal shutter becomes opaque, thereby excluding light from face 46 to prevent the image of board surface 20 from being received and transmitted to imaging face 46. The resulting display is shown in FIG. 5 and includes features only of component surface 16, thereby permitting the operator to readily identify solder bumps 18. The electrical potential is removed from liquid crystal shutter, whereupon the shutter again becomes transparent. Similarly, an electrical potential is applied to shutter 70 to cause the shutter to become opaque, thereby excluding the image of component surface 16. The resulting display is shown in FIG. 6 and includes features only of the board surface 20, thereby permitting the operator to readily identify bond pads 22. Liquid crystal shutter 70 is then deactuated and becomes transparent, whereupon the display again shows the superposed images of the facing surfaces. Having thus identified the bond pads 22 and solder bumps 18, the operator then makes adjustments to the relative positions of component 12 and board 14 to align the solder bumps 18 with the bond pads 22. FIG. 7 shows the display following alignment of solder bumps and the bond pads. Arm 32 is then retracted to withdrawn probe 30, whereafter fixture 26 is accurately lowered along the z-axis to place component 12 precisely onto board 14.

Therefore, this invention provides an improved probe for a precision placement apparatus that positions component onto a substrate based upon features found on facing surfaces. The probe includes a dual prism assembly that is interposed between the facing surfaces and combines the images received by the opposite faces of the dual prism assembly for viewing the superposed images of the facing surfaces. In accordance with this invention, the probe further includes at least one liquid crystal shutter that is disposed between a face of the dual prism assembly and the corresponding surface that is viewed by that face. When actuated, the liquid crystal shutter selectively blocks the image of the one surface so that the image produced by the dual prism assembly corresponds only to the image of the opposite surface. Thus, the operator is able to readily determine the features of the individual surfaces. During alignment, only a small distance separates the facing surfaces of the microelectronic elements. It is desired to minimize the distance, in part, to minimize deviation associated with movement along the z-axis during assembly. Liquid crystal shutters feature a low profile that may be suitably mounted onto the dual prism assembly without significantly increasing the distance and thereby remain within the z-axis precision capabilities of commercially available alignment apparatus. In addition, liquid crystal shutters are lightweight and may be mounted onto the probe without significantly interfering with the reciprocal movement into and out of the gap. Moreover, the liquid crystal shutter is actuated electrically and does not involve a mechanical mechanism mounted onto the probe that might disturb the probe, which is sensitive to even microscopic movement that becomes magnified within the display. Still further, liquid crystal shutter facilitates computerized automation of the alignment operation, which is heretofore been hindered by the complexity of analyzing the superposed images. In the described embodiment, the improved dual prism probe is employed in aligning solder bumps and bond pads. However, the apparatus may be utilized for purposes of positioning elements based upon fiducials or other markings on the facing surfaces.

While this invention has been described in terms of certain embodiments thereof, it is not intended that it be limited to the above description, but rather only to the extent set forth in the claims that follow.

The embodiments of this invention in which an exclusive property or privilege is claimed are defined as follows:

I claim:

1. A precision placement apparatus for assembling a component having a component surface to a substrate having a substrate surface facing said component surface and spaced apart therefrom, said precision apparatus comprising a probe interposable between the component and substrate surfaces and comprising a dual prism assembly having a first face for receiving an image of the component surface and a second face opposite the first face for receiving an image of the substrate surface, said dual prism assembly superposing the images and further comprising an imaging face for viewing the superposed images and a liquid crystal shutter overlying at least one face of said first face and said second face and selectively actuable between a transparent state for admitting light to said at least one face and an opaque state for excluding light from said at least one face, such that the image received opposite said at least one face is viewable at the imaging face.

2. A precision placement apparatus for assembling a component having a component surface to a substrate having a substrate surface facing said component surface and spaced apart therefrom, said precision placement apparatus comprising a probe interposable between the component and the substrate surfaces and comprising a dual prism assembly comprising a first right prism having a first hypotenuse side and a second right prism having a second hypotenuse side bonded to the first hypotenuse side, said dual prism assembly comprising a first face oriented for receiving an image of the component surface and a second face opposite the first face and oriented for receiving an image of the substrate surface, and an imaging face at which the images are viewable as superposed images, and a liquid crystal shutter covering at least one face of said first face and said second face and selectively actuatable between a transparent state for admitting light to said at least one face and an opaque state for excluding light to said at least one face, such that the image received opposite said at least one face is viewable at the imaging face without the image from said at least one face.

3. A precision placement apparatus in accordance with claim 2 wherein the probe comprises a mirror affixed to the dual prism assembly opposite the imaging face.

4. A precision placement apparatus in accordance with claim 2 wherein the probe comprises reciprocal arm whereon the dual prism assembly and said the liquid crystal shutter are mounted, said reciprocal arm being reciprocal between alignment position wherein the dual prism assembly is interposed between the component surface and substrate surface and withdrawn position wherein the dual prism assembly is withdrawn from between the component and substrate.

5. A precision placement apparatus in accordance with claim 2 wherein the precision placement apparatus comprises a camera for viewing the imaging face for creating a video display of the images.

6. A precision placement apparatus in accordance with claim 2 wherein the probe further including a liquid crystal shutter covering said first face and said second face respectively and selectively actuatable between a transparent state for admitting light and an opaque state for excluding light.

* * * * *